(12) United States Patent
Mochizuki (10) Patent No.: US 7,339,389 B2
(45) Date of Patent: Mar. 4, 2008

(54) SEMICONDUCTOR DEVICE INCORPORATING CHARACTERISTIC EVALUATING CIRCUIT OPERATED BY HIGH FREQUENCY CLOCK SIGNAL

(75) Inventor: Hideo Mochizuki, Kanagawa (JP)

(73) Assignee: NEC Electronics Corporation, Kawasaki-shi, Kanagawa (JP)

(*) Notice: Subject to any disclaimer, the term of this patent is extended or adjusted under 35 U.S.C. 154(b) by 45 days.

(21) Appl. No.: 11/086,742

(22) Filed: Mar. 23, 2005

(65) Prior Publication Data
US 2005/0212550 A1 Sep. 29, 2005

(30) Foreign Application Priority Data
Mar. 24, 2004 (JP) ............... 2004-087854

(51) Int. Cl.
*G01R 31/02* (2006.01)
(52) U.S. Cl. ............... 324/763; 324/765; 324/158.1; 714/733; 714/734
(58) Field of Classification Search ............... 324/763, 324/765, 158.1, 760; 714/733, 734; 368/118
See application file for complete search history.

(56) References Cited

U.S. PATENT DOCUMENTS

| | | | | |
|---|---|---|---|---|
| 5,248,936 A | * | 9/1993 | Nakata et al. | 324/73.1 |
| 5,578,935 A | * | 11/1996 | Burns | 324/763 |
| 5,592,496 A | * | 1/1997 | Shimizu et al. | 714/740 |
| 5,892,368 A | * | 4/1999 | Nakata et al. | 324/763 |
| 6,005,407 A | * | 12/1999 | Arabi et al. | 324/765 |
| 6,348,806 B1 | * | 2/2002 | Okandan et al. | 324/763 |
| 6,385,273 B1 | * | 5/2002 | Hsu et al. | 377/19 |
| 6,476,615 B1 | * | 11/2002 | Marbot et al. | 324/537 |
| 6,545,481 B1 | * | 4/2003 | Emberty et al. | 324/521 |
| 6,651,202 B1 | * | 11/2003 | Phan | 714/733 |
| 6,917,215 B2 | * | 7/2005 | Ichikawa | 324/765 |
| 6,956,395 B2 | * | 10/2005 | Oshima et al. | 324/765 |

FOREIGN PATENT DOCUMENTS

JP 11-27128 1/1999

* cited by examiner

*Primary Examiner*—Ha Tran Nguyen
*Assistant Examiner*—Arleen M. Vazquez
(74) *Attorney, Agent, or Firm*—McGinn IP Law Group, PLLC (57) ABSTRACT

In a semiconductor device, a main circuit is operated by a first clock signal, and at least one characteristic evaluating circuit is operated by a second clock signal whose frequency is higher than a frequency of the first clock signal. Also, at least one deterioration detecting circuit is connected to the characteristic evaluating circuit and Is adapted to detect deterioration of the characteristic evaluating circuit.

18 Claims, 6 Drawing Sheets

SEMICONDUCTOR DEVICE INCORPORATING CHARACTERISTIC EVALUATING CIRCUIT OPERATED BY HIGH FREQUENCY CLOCK SIGNAL

BACKGROUND OF THE INVENTION

1. Field of the Invention

The present invention relates to a semiconductor device incorporating a characteristic evaluating circuit.

2. Description of the Related Art

Generally, as time goes by, semiconductor devices deteriorate and break down. Therefore, in order to evaluate the characteristics of semiconductor devices, when new semiconductor devices are designed, developed and experimented with, characteristic evaluating circuits are incorporated therein to carry out various reliability tests. Only after the devices have passed the reliability tests, are the new semiconductor devices actually manufactured as products for shipping. The manufactured semiconductor devices are then assembled and mounted on a system board.

In spite of the semiconductor devices having passed the reliability tests, if one of the semiconductor devices on the system board deteriorates, the entire system board would break down.

In order to detect deterioration of the characteristics of semiconductor devices even after the semiconductor devices are assembled and mounted on a system board, a prior art semiconductor device is known where a characteristic evaluating circuit is introduced (see: JP-11-27128-A).

In the above-mentioned prior art semiconductor device, in a normal operation mode, a main circuit such as a logic circuit and a characteristic evaluating circuit are operated by the same clock signal, and in a characteristic evaluating mode, the characteristic evaluating circuit is electrically separated from the main circuit. This will be explained later in detail.

In the above-described prior art semiconductor device, however, since the main circuit and the characteristic evaluating circuit are operated by the same clock signal, when deterioration of the characteristic of the transistor of characteristic evaluating circuit is detected, the characteristics of the transistors of the main circuit also would deteriorate. Therefore, after the deterioration of the characteristic of the transistor of the characteristic evaluating circuit is detected, a system board on which this semiconductor device is mounted would break down.

Also, in the above-described prior art semiconductor device, in order to evaluate the characteristic evaluating circuit, a monitoring circuit such as a reference circuit for determining or not whether a detected threshold voltage is within a predetermined range, will be necessary. In addition, the characteristic evaluation circuit requires an output terminal. Therefore, this semiconductor device is disadvantageous in size.

SUMMARY OF THE INVENTION

It is an object of the present invention to provide a semiconductor device capable of avoiding the breakdown of a system board on which the semiconductor device is mounted.

Another object of the present invention is to decrease the size of a semiconductor device incorporating a characteristic evaluating circuit.

According to the present invention, in a semiconductor device, a main circuit is operated by a first clock signal, and at least one characteristic evaluating circuit associated with a deteriorating detecting circuit is operated by a second clock signal whose frequency is higher than a frequency of the first clock signal.

Thus, the characteristic evaluating circuit would deteriorate earlier than the main circuit, which would replace the semiconductor device by another semiconductor device before the main circuit deteriorates. Therefore, a system board on which the semiconductor device is mounted would not break down. Also, the output signal of the deterioration detecting circuit can be monitored by the main circuit which would be operated normally even after the characteristic evaluating circuit has deteriorated.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENT

Before the description of the preferred embodiment, a prior art semiconductor device will be explained with reference to FIGS. 1A and 1B (see: JP-11-27128-A). Note that FIG. 1A is used for explaining a normal operation mode and FIG. 1B is used for explaining a characteristic evaluating mode.

Figure 1A:
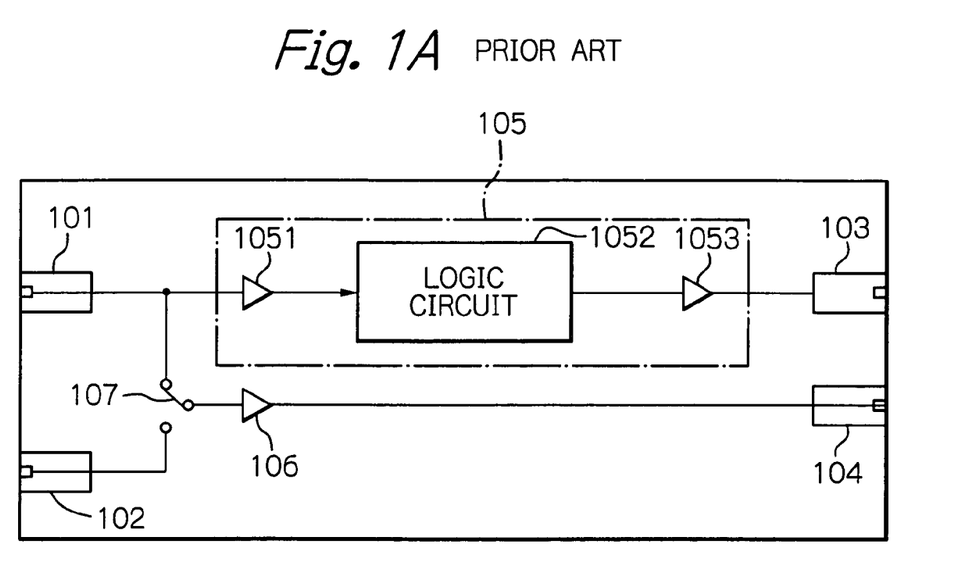
FIGS. 1A and 1B are block circuit diagrams illustrating a prior art semiconductor device.
Figure 1B:
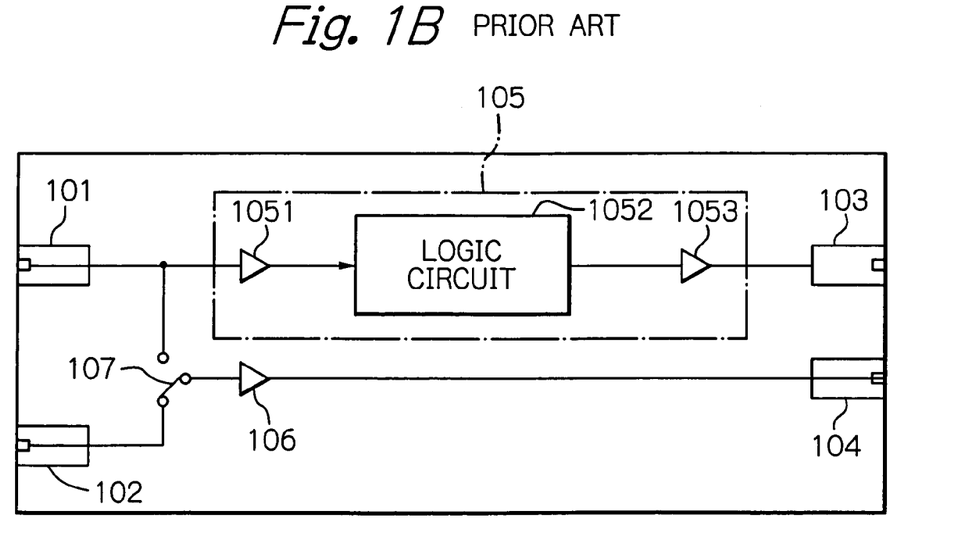

In FIGS. 1A and 1B, reference numeral 101 designates an input terminal for the normal operation mode, and 102 designates an input terminal for the characteristic evaluating mode. Also, reference numeral 103 designates an output terminal for the normal operation mode, and 104 designates an output terminal for the characteristic evaluating mode.

Provided between the input terminal 101 and the output terminal 103 is a main circuit 105 for the normal operation mode. The main circuit 105 is formed by a gate circuit 1051, a logic circuit 1052 and a gate circuit 1053.

Also, provided between the input terminals 101 and 102 and the output terminal 104 is a gate circuit 106 for the characteristic evaluation mode.

Further, a switch 107 is interposed between the input terminals 101 and 102 and the gate circuit 106.

In the normal operation mode, as illustrated in FIG. 1A, the switch 107 is located at an upper side. As a result, an input signal supplied to the input terminal 101 is supplied to the main circuit 105 and the gate circuit 106. Therefore, the characteristic of the gate circuit 106 will deteriorate in the same manner as the characteristics of the main circuit 105. Particularly, if the input signal supplied to the input terminal 101 is preferably a clock signal whose frequency may be highest among the input signals, the transistor of the gate circuit 107 would be subject to deterioration as early as those of the main circuit 105.

On the other hand, in the characteristic evaluating mode as illustrated in FIG. 1B, the switch 107 is located at a lower side. As a result, an input signal supplied to the input terminal 102 is supplied to the gate circuit 106. Therefore, the characteristic of the gate circuit 106 can be evaluated by monitoring an output signal at the output terminal 104.

For example, if the threshold voltage of the transistor of the gate circuit 106 is expected to be detected, the voltage of the input signal at the input terminal 102 is gradually increased while the voltage of the output signal at the output terminal 104 is monitored. Then, the deterioration of the gate circuit 106 can be evaluated by determining whether or not the detected threshold voltage is within a predetermined range. Thus, the deterioration of the characteristics of the main circuit 105 can be determined by the deterioration of the characteristic of the gate circuit 106.

In the semiconductor device of FIGS. 1A and 1B, however, since the main circuit 105 for the normal operation mode as well as the gate circuit 106 for the characteristic evaluating mode are operated by the same input signal (or clock signal), when the deterioration of the characteristic of the transistor of the gate circuit 106 for the characteristic evaluating mode is detected, the characteristics of the transistors of the main circuit 105 for the normal operation mode also would deteriorate. Therefore, after the deterioration of the characteristic of the transistor of the gate circuit 106 for the characteristic evaluating mode is detected, a system board on which the semiconductor device of FIG. 1 is mounted would break down.

Also, in the semiconductor device of FIG. 1, in order to evaluate the gate circuit 106 for the characteristic evaluating mode, a monitoring circuit such as a reference circuit for determining or not whether a detected threshold voltage is within a predetermined range will be necessary. In addition, the gate circuit 106 requires the output terminal 104. Therefore, the semiconductor device of FIG. 1 is disadvantageous in size.

Figure 2:
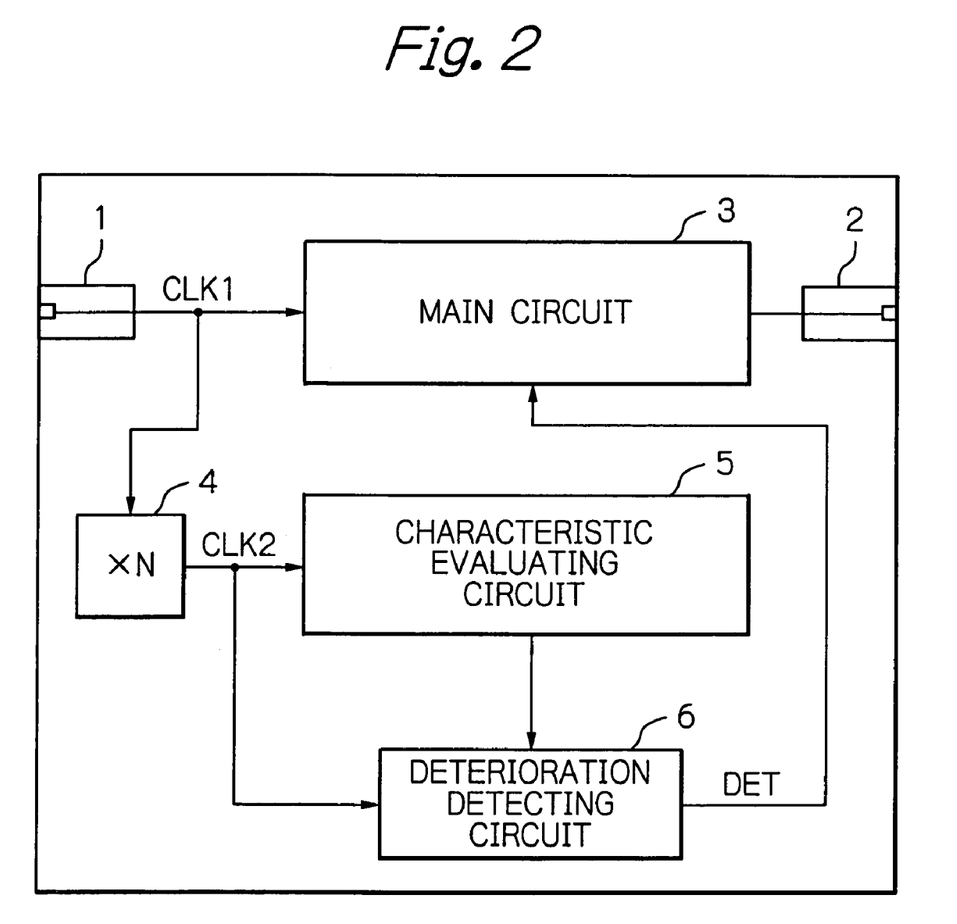
FIG. 2 is a block circuit illustrating an embodiment of the semiconductor device according to the present invention.

In FIG. 2, which illustrates an embodiment of the semiconductor device according to the present invention, reference numeral 1 designates a clock input terminal for receiving a clock signal CLK1, and 2 designates an output terminal generating an output signal.

Provided between the clock input terminal 1 and the output terminal 2 is a main circuit 3 including a logic circuit and the like.

In order to detect the deterioration of the transistors of the main circuit 3 and the deterioration of the aluminum connections of the main circuit 3 due to the electromigration before such transistors and aluminum connections actually deteriorate, a frequency multiplier 4, a characteristic evaluating circuit 5 and a deterioration detecting circuit 6 are provided. In this case, the characteristic evaluating circuit 5 is constructed by similar transistors and connections to those of the main circuit 3.

The frequency multiplier 4 is connected to the clock input terminal 1 to generate a clock signal CLK2 whose frequency is higher than that of the clock signal CLK1 For example, the ratio N of the frequency of the clock signal CLK2 to that of the clock signal CLK1 is 2. Since the characteristic evaluation circuit 5 is operated by the clock signal CLK2 whose frequency is higher than that of the clock signal CLK1, the characteristic evaluating circuit 5 would deteriorate earlier than the main circuit 3. As a result, even when the characteristic evaluating circuit 5 deteriorates, the main circuit 3 can still be normally operated, so that the detection signal DET of the deterioration detecting circuit 6 can be processed by the main circuit 3. Thus, an output terminal for the deterioration detecting circuit 6 is unnecessary, which would decrease the size of the semiconductor device of FIG. 2. Also, the reference circuit required in the semiconductor device of FIGS. 1A and 1B is unnecessary, which further would decrease the size of the semiconductor device of FIG. 2.

Also, if the semiconductor device of FIG. 2 is mounted on a system board, the semiconductor device of FIG. 2 can be replaced by another semiconductor device before the semiconductor device of FIG. 2 actually deteriorates, so that the system board would not break down.

Note that the deterioration detecting circuit 6 is also operated by the clock signal CLK2.

Figure 3:
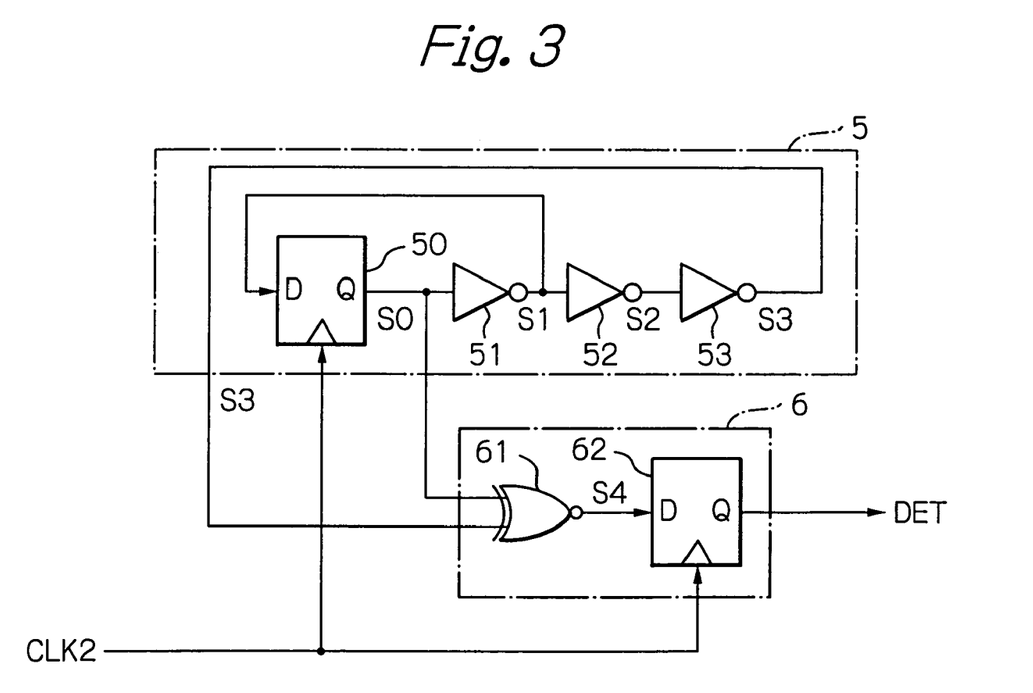
FIG. 3 is a detailed circuit diagram of the characteristic evaluating circuit and the deterioration detecting circuit of FIG. 2.

In FIG. 3, which is a detailed circuit diagram of the characteristic evaluating circuit 5 and the deterioration detecting circuit 6 of FIG. 2, the characteristic evaluating circuit 5 is constructed by a series of inverters 51, 52 and 53, and a D-type flip-flop 50 for latching the output signal of the inverter 51 in synchronization with the clock signal CLK2 to feed it back to the input of the inverter 51. In this case, the characteristic evaluating circuit 5 forms a critical path or a maximum delay path of the semiconductor device of FIG. 2. Concretely, a time period from the rising edge of the output signal S0 of the D-type flip-flop 50 to a timing of the falling edge of the output signal S3 of the inverter 53 is within one cycle of the clock signal CLK2. Preferably, one cycle of the output signal S3 of the inverter 53 is the same as one cycle of the clock signal CLK2.

The deterioration detecting circuit 6 is constructed by an exclusive NOR circuit 61 as a coincidence circuit for determining whether or not the output signal S0 of the D-type flip-flop 50 coincides with the output signal S3 of the inverter 53, and a D-type flip-flop 62 for latching the output signal S4 of the exclusive NOR circuit 61 in synchronization with the clock signal CLK2.

A first operation of the characteristic evaluating circuit 5 and the deterioration detecting circuit 6 of FIG. 3 is explained next with reference to FIGS. 4A through 4G where the characteristic evaluating circuit 5 of FIG. 3 has not deteriorated.

Figure 4A:
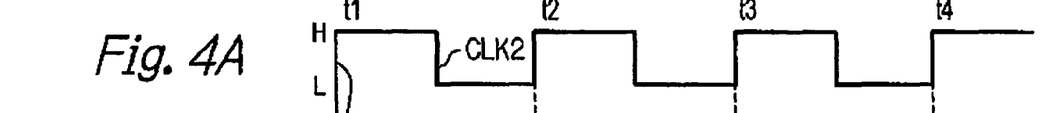
FIGS. 4A through 4G are timing diagrams for explaining a first operation of the characteristic evaluating circuit and the deterioration detecting circuit of FIG. 3 where the characteristic evaluating circuit of FIG. 3 has not deteriorated.
Figure 4B:
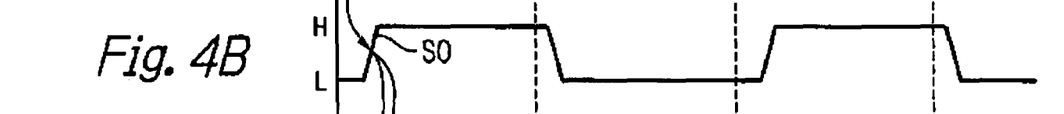

As shown in FIGS. 4A, and 4B, the output signal S0 of the D-type flip-flop 50 is generated in accordance with a delay time of the D-type flip-flop 50.

Figure 4C:
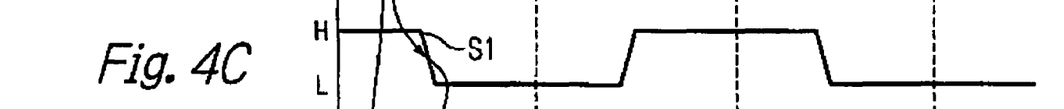
Figure 4D:
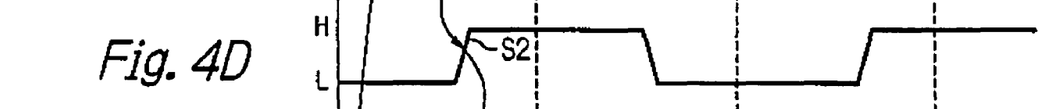
Figure 4E:
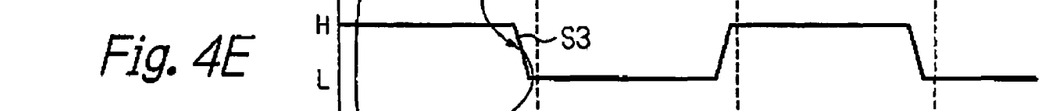

As shown in FIGS. 4C, 4D and 4E, the output signals S1, S2 and S3 of the inverters 51, 52 and 53 are changed, so that the output signal S3 of the inverter 53 falls before the next rising edge of the clock signal CLK2 at time t2 or t4.

Figure 4F:
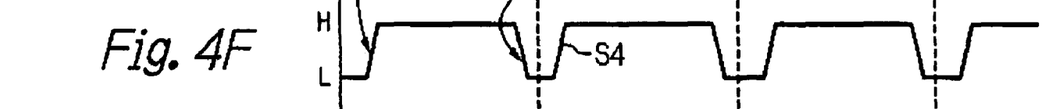

As a result, as shown in FIG. 4F, since the output signal S0 of the D-type flip-flop 50 becomes different from the output signal S3 of the inverter 53, the output signal S4 of the exclusive NOR circuit 61 becomes low at time t2 or t4.

Figure 4G:
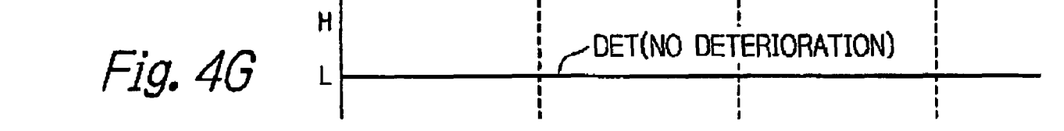

Thus, as shown in FIG. 4G, the low output signal S4 of the exclusive NOR circuit 61 is latched by the D-type flop-flip 62 at time t2 or t4, so that the detection signal DET remains low, which means there is no deterioration generated in the characteristic evaluating circuit 5.

A second operation of the characteristic evaluating circuit 5 and the deterioration detecting circuit 6 of FIG. 3 is explained next with reference to FIGS. 5A through 5G where the characteristic evaluating circuit 5 of FIG. 3 has deteriorated.

Figure 5A:
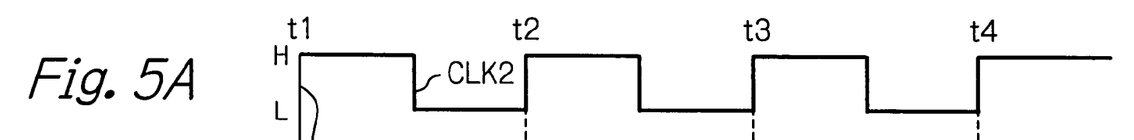
FIGS. 5A through 5G are timing diagrams for explaining a second operation of the characteristic evaluating circuit and the deterioration detecting circuit of FIG. 3 where the characteristic evaluating circuit of FIG. 3 has deteriorated.
Figure 5B:
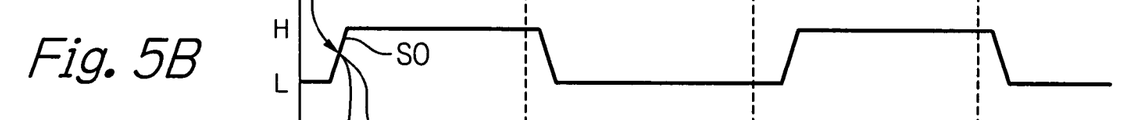

As shown in FIGS. 5A, and 5B, the output signal S0 of the D-type flip-flop 50 is generated in accordance with a delay time of the D-type flip-flop 50.

Figure 5C:
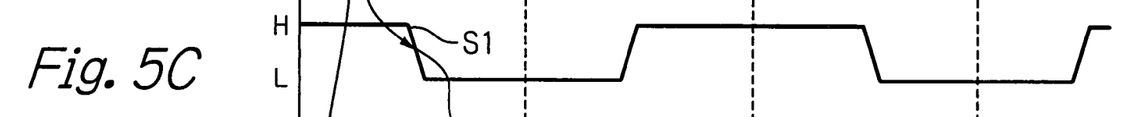
Figure 5D:
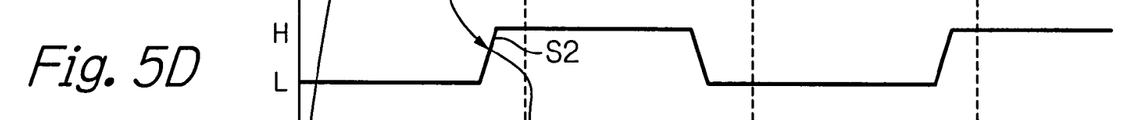
Figure 5E:
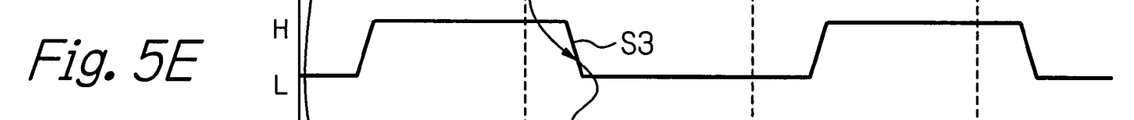

As shown in FIGS. 5C, 5D and 5E, the output signals S1, S2 and S3 of the inverters 51, 52 and 53 are changed, so that the output signal S3 of the inverter 53 falls after the next rising edge of the clock signal CLK2 at time t2 or t4.

Figure 5F:
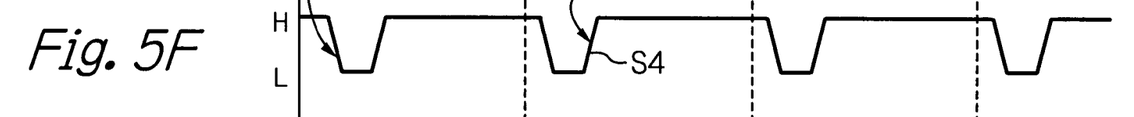

As a result, as shown in FIG. 5F, since the output signal S0 of the D-type flip-flop 50 becomes the same as the output signal S3 of the inverter 53, the output signal S4 of the exclusive NOR circuit 61 becomes high at time t2 or t4.

Figure 5G:
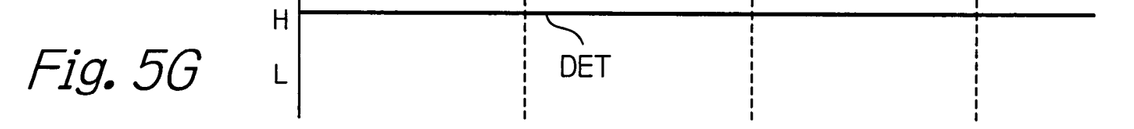

Thus, as shown in FIG. 5G, the high output signal S4 of the exclusive NOR circuit 61 is latched by the D-type flop-flip 62 at time t2 or t4, so that the detection signal DET remains high, which means there is a deterioration generated in the characteristic evaluating circuit 5.

In FIG. 3, if the transistors of the characteristic evaluating circuit 5 are constructed so as to have smaller amplification factors than those of the main circuit 3, the deterioration of the characteristics of the transistors of the main circuit 3 can be evaluated. On the other hand, if the transistors of the characteristic evaluating circuit 5 are constructed so as to have larger amplification factors than those of the main circuit 3, the deterioration of the characteristics of the connections of the main circuit 3 can be evaluated.

Also, other configurations can be adopted for the characteristic evaluating circuit 5 as well as the deterioration detecting circuit 6.

Figure 6:
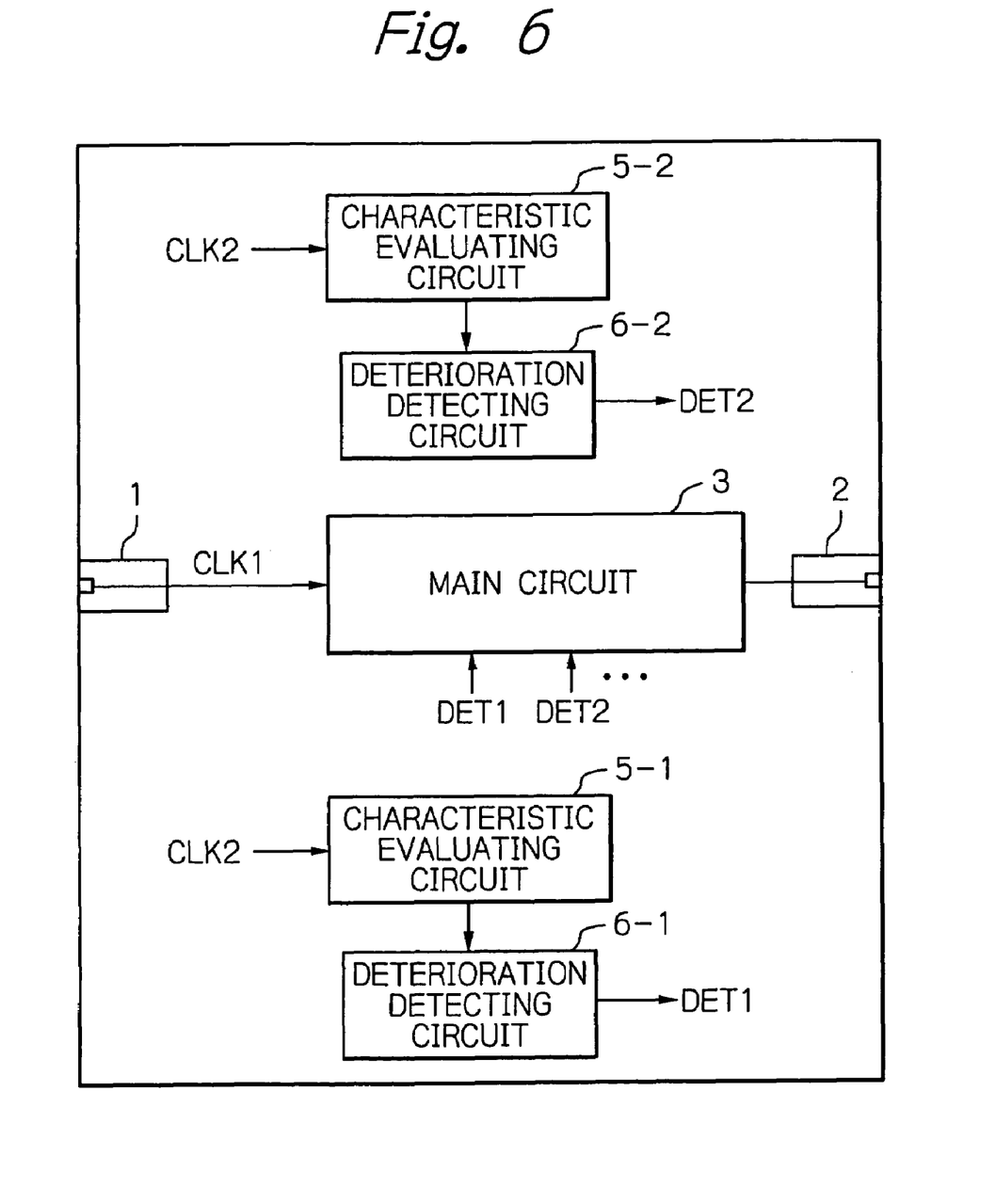
FIG. 6 is a block circuit diagram illustrating a modification of the semiconductor device of FIG. 3.

Further, a plurality of characteristic evaluating circuits 5-1, 5-2, . . . associated with deterioration detecting circuits 6-1, 6-2, . . . can be provided in one semiconductor device as illustrated in FIG. 6. In this case, the transistors and connections of one of the characteristic evaluating circuits can be different from those of the others.

As explained hereinabove, according to the present Invention, the breakdown of a system board on which the semiconductor device according to the present invention is mounted can be avoided. Also, the size of a semiconductor device incorporating a characteristic evaluating circuit can be decreased.

The invention claimed is:

1. A semiconductor device comprising:
a main circuit operated by a first clock signal;
at least one characteristic evaluating circuit operated by a second clock signal whose frequency is higher than a frequency of said first clock signal; and
at least one deterioration detecting circuit connected to said characteristic evaluating circuit and being adapted to detect deterioration of said characteristic evaluating circuit.

2. The semiconductor device as set forth in claim 1, further comprising a clock input terminal connected to said main circuit and being adapted to receive said first clock signal from the exterior and transmit said first clock signal to said main circuit.

3. The semiconductor device as set forth in claim 2, further comprising a frequency multiplier connected between said clock input terminal and said characteristic evaluating circuit, said frequency multiplier being adapted to receive said first clock signal from said clock input terminal to generate said second clock signal.

4. The semiconductor device as set forth in claim 1, wherein said characteristic evaluating circuit comprises:
a first D-type flip-flop;
a plurality of inverters connected between an output of said first D-type flip-flop and an output of said characteristic evaluating circuit, an output of an intermediate one of said inverters being connected to a data input of said first D-type flip-flop, so that an output signal of the intermediate one of said inverters is latched in said first D-type flip-flop clocked by said second clock signal,
said deterioration detecting circuit comprising:
a coincidence circuit adapted to compare an output signal of said first D-type flip-flop with an output signal of said characteristic evaluating circuit; and
a second D-type flip-flop connected to said coincidence circuit and adapted to latch an output signal of said coincidence circuit clocked by said second clock signal.

5. The semiconductor device as set forth in claim 1, wherein an output of said deterioration detecting circuit is connected to said main circuit, so that said main circuit can recognize a detection of deterioration of said characteristic evaluating circuit.

6. The semiconductor device as set forth in claim 1, wherein the at least one characteristic evaluating circuit and the main circuit comprise similar transistors.

7. The semiconductor device as set forth in claim 1, wherein the main circuit processes a deterioration detect signal output from the at least one deterioration detecting circuit.

8. The semiconductor device as set forth in claim 1, wherein the at least one deterioration detecting circuit outputs a deterioration detect signal to the main circuit.

9. The semiconductor device as set forth in claim 1, wherein said characteristic evaluating circuit generates first and second signals depending on the deterioration of said characteristic evaluating circuit, and said deterioration detecting circuit receives said first and second signals to generate a deterioration detection signal.

10. The semiconductor device as set forth in claim 9, wherein said second signal comprises a delayed signal of said first signal.

11. The semiconductor device as set forth in claim 10, wherein said detection signal depends upon a difference in delay time between said first and second signals.

12. A method for detecting a deterioration in a semiconductor device comprising:
providing a main circuit operated by a first clock signal;
providing a characteristic evaluating circuit operated by a second clock signal, a frequency of which is higher than a frequency of said first clock signal; and
providing a deterioration detecting circuit connected to said characteristic evaluating circuit adapted to detect deterioration of said characteristic evaluating circuit.

13. The method as set forth in claim 12, wherein the characteristic evaluating circuit and the main circuit comprise similar transistors.

14. The method as set forth in claim 12, wherein the main circuit receives a deterioration detect signal output from the deterioration detecting circuit.

15. The method as set forth in claim 12, wherein the at least one deterioration detecting circuit outputs a deterioration detect signal to the main circuit.

16. The method as set forth in claim 12, further comprising providing a clock input terminal to said main circuit to receive said first clock signal from an exterior clock.

17. The method as set forth in claim 16, further comprising providing a frequency multiplier connected between said clock input terminal and said characteristic evaluating circuit receiving said first clock signal from said clock input terminal and generating said second clock signal.

18. The method as set forth in claim 12, further comprising providing said characteristic evaluating circuit with transistors having one of smaller and larger amplification factors than transistors of said main circuit.

* * * * *